United States Patent [19]

Cipolla et al.

[11] Patent Number: 4,875,614
[45] Date of Patent: Oct. 24, 1989

[54] ALIGNMENT DEVICE

[75] Inventors: Thomas M. Cipolla, Hopewell Junction; Raymond R. Horton, Dover Plains, both of N.Y.; Philip Murphy, New Fairfield, Conn.; Michael J. Palmer, Walden, N.Y.

[73] Assignee: International Business Machines Corporation, Armonk, N.Y.

[21] Appl. No.: 264,713

[22] Filed: Oct. 31, 1988

[51] Int. Cl.[4] .............................................. B23K 20/02
[52] U.S. Cl. ...................................... 228/5.5; 228/6.2; 228/44.7; 269/258; 269/903
[58] Field of Search ..................... 228/49.1, 6.2, 44.7, 228/106, 108.2, 5.5, 106; 269/258, 903

[56] References Cited

U.S. PATENT DOCUMENTS

| | | | |
|---|---|---|---|
| 1,059,545 | 4/1913 | Kunze | 269/258 |
| 2,325,387 | 7/1943 | Fredrickson | 269/258 |
| 3,259,367 | 7/1966 | Squire | 254/101 |
| 3,529,759 | 9/1970 | Clark | 228/6.2 |
| 3,574,923 | 4/1971 | Cushman . | |
| 3,608,809 | 8/1968 | Cushman . | |
| 3,669,333 | 2/1970 | Coucoulas . | |
| 3,823,863 | 7/1973 | Piechocki . | |
| 3,905,537 | 7/1984 | Schmehl . | |
| 3,957,185 | 8/1975 | Kauffman et al. . | |
| 4,184,623 | 9/1977 | Strasser . | |
| 4,600,228 | 7/1986 | Tarbuck | 228/6.2 |
| 4,768,702 | 9/1988 | Takahashi et al. | 228/44.7 |

FOREIGN PATENT DOCUMENTS

| | | | |
|---|---|---|---|
| 52369 | 4/1977 | Japan | 228/44.7 |
| 215286 | 12/1983 | Japan | 228/44.7 |
| 94749 | 5/1985 | Japan | 228/180.2 |

OTHER PUBLICATIONS

IBM TDB, vol. 11, No. 8, Jan. 1969, p. 1026 entitled "Self-Leveling Soldering Tool", by N. F. Jensen.
IBM Technical Disclosure Bulletin; vol. 31, No. 6, Nov. 1988; pp. 236–237, "Equal Force Planarity Device".

Primary Examiner—Nicholas P. Godici
Assistant Examiner—Samuel M. Heinrich
Attorney, Agent, or Firm—Daniel P. Morris

[57] ABSTRACT

Apparatus for automatically adjusting the orientation of a first surface of a first body to be against a second surface of a second body when said first surface is pressed against said second surface. The apparatus includes a means for movably mounting the first body to a support which permits rotation of the first surface so that when the first surface is pressed against the second surface, the first surface rotates with respect to the support resulting in the first surface being against the second surface.

28 Claims, 10 Drawing Sheets

ALIGNMENT DEVICE

DESCRIPTION

1. Field of the Invention

This invention relates to an apparatus for aligning a first surface against a second surface by pressing the first surface against the second surface. More particularly, this invention relates to an apparatus for aligning a bond head in substantially parallel relationship with beam leads aligned with and contacting contact locations on a substrate surface by pressing the bond head against the beam leads, and aligning a first and second electronic device in substantially parallel relationship with beam leads disposed therebetween by pressing the first electronic device against the second electronic device.

2. Background of the Invention

In the tape automated bonding (TAB) microelectronic technology, a set of beam leads each having an inner lead bond end (ILB) and each having an outer lead bond end (OLB) are used to electrically interconnect an electronic device, for example, a semiconductor chip, to an electronic packaging substrate, for example a printed circuit board. The ILB ends are bonded to contact locations on the electronic device. The OLB ends are bonded to contact locations on the packaging substrate. The beam lead set is carried by the TAB tape. The inner lead bond ends of one set are disposed over and aligned with the electronic device contact locations. A bond head is generally brought over the inner lead bond ends. The bond head is heated and pressed against the inner lead bond ends to thermocompression bond the inner lead bond ends to the electronic device contact locations. The outer lead bond ends of the beam leads can be bonded in similar fashion to contact locations on the electronic device packaging substrate. Both the inner and outer lead bond ends can be bonded to the contact locations by other means such as solder bonding. In the process of bonding the inner lead bond ends to the electronic device or the outer lead bond ends to the packaging substrate, it is essential that the bond head be substantially parallel to the substrate to which the bonds are made. The degree to which they are parallel determines to a large degree the uniformity of heat and force applied to the leads. Non-uniform temperature or force results in poor quality bonds between the beam leads and contact locations and also results in a lack of control of the process. In commonly available bonding equipment, the bond head is adjusted to be substantially parallel to the substrate to which the beam lead ends are being bonded by a manual adjustment. This involves turning adjustment screws as an initial step in the use of the bonding tool. How well this adjustment is made largely determines the quality of the bonds. Further, the process of adjustment is one of trial and error since the only way to determine if the adjustment is correct is to apply force to an electronic device or packaging substrate with the bonding apparatus and thereafter to look at the results of the test bond. The required planarity is achieved by a trial and error process. Beam lead ends are bonded to contact locations on a substrate. The bonds are examined and if needed an adjustment is made manually. This process is repeated until the desired planarity is achieved. This results in the adjustment process being several hours in duration every time a bond head is changed. This also makes the quality of the bonds largely dependent on the skill of the apparatus adjuster.

It is an object of this invention to provide an apparatus for adjusting the orientation of a surface of a first body to be substantially flush against a second surface of a second body when the first surface is pressed against the second surface.

It is another object of this invention to provide an apparatus for applying substantially uniform force to a plurality of conducting beam lead ends which are aligned in close contact with respective contact locations on a substrate surface.

It is another object of this invention to provide an apparatus for applying substantially uniform force to a first electronic device which is pressed against a second electronic device with beam leads projecting inwardly between the first and second electronic device for bonding the beam leads to contact locations on the first and second electronic devices.

The article of N.F. Jensen entitled "Self-Leveling Soldering Tool", IBM TDB Vol. 11, No. 8, January 1969, p. 1026 describes a solder bonding tool which has a ball joint enabling a block with bond head elements attached thereto to swivel in multiple directions from its normally level orientation relative to a housing to which it is held by symmetrically located springs. The ball permits self adjustment of the bond head elements to conform to slight irregularities at the soldering surface of the board. Leads on a chip are aligned with contact pads on a board. The bond head tip is aligned with the lead ends and pressed against the leads. The apparatus of Jensen permits the plane containing the tips of the bond heads to swing through an arc in space so that when the bond head tip is pressed against the leads aligned with contacts on the board, the bond head tip will have a lateral movement which can damage the lead and contacts and can push the leads out of alignment with the pads. The apparatus of Jensen has an additional problem. Since the block with the bond head swivels on a ball and socket joint, the plane of the bond head can twist about an axis perpendicular to this plane. When the head is pressed against the leads, this twist will cause an additional misalignment between the bond head tip and the leads.

U.S. Pat. No. 3,524,923 to Cushman describes a bonding tool which has a ball joint enabling a platform with a work piece attached thereto to swivel in multiple directions from its normal orientation relative to the support to which the ball joint is attached. A bond head holding a chip with leads attached thereto is pressed against the work piece. Before pressing, the leads are aligned to contact pads on the work piece. The ball joint allows the work piece to move to be parallel dispersed against the leads. As with the apparatus of Jensen, since the block with the work piece thereon swivels on a ball joint, the work piece can twist about an axis perpendicular to the plane of the work piece misaligning the leads and contact pads. At column 4, lines 38 to 44, Jensen indicates it may be desirable to provide against this twist. Jensen says that "any suitable facility may be employed for prohibiting rotation of the platform which does not interfere with the desired pivotal movement of the platform or the desired lateral displacement of the platform pivot." Jensen provides no teaching on how to prevent the rotation. Also, as with the apparatus of Jensen, the ball and socket joint permits the plane of the work piece to swing through an arc in space so that when the leads are pressed against the work piece pads, there is a lateral displacement of the contact pads. The solution of Cashman to this problem is to mount the ball in a resilient 0-ring retained in the bore hole into which the ball is inserted. The 0-ring compresses permitting the ball to move laterally to avoid the lateral movement of the work piece.

It is another object of this invention to avoid lateral displacement of the first surface, when pressed against the second surface, without using a ball and socket joint containing a resilient member to absorb lateral displacement.

It is another object of this invention to avoid twisting of the first surface, when pressed against the second surface.

SUMMARY OF THE INVENTION

In its broadest aspect, the invention is an apparatus for adjusting the orientation of a first surface of a first body to be substantially flush against a second surface of a second body when said first surface is pressed against said second surface In a more particular aspect of this invention, the first surface rotates on space about a point thereon, thereby avoiding lateral displacement of the first surface.

In another more particular aspect of this invention, the first body is movably mounted to a support permitting rotation of the first surface about a first and second axis so that when the first surface is pressed against the second surface, the first surface rotates about the first and the second axis resulting in the first surface being substantially flush against the second surface.

In another more particular aspect of the present invention, the first body is movably mounted to the support by a plurality of bearing means.

In another more particular aspect of the present invention, the two axes of rotation are mutually perpendicular and intersect at a point on the first surface. The first surface rotates about the intersection point.

These and other objects, features and advantages will be apparent from the following more particular description of the preferred embodiments.

DETAILED DESCRIPTION OF THE PREFERRED EMBODIMENTS

Figure 1:
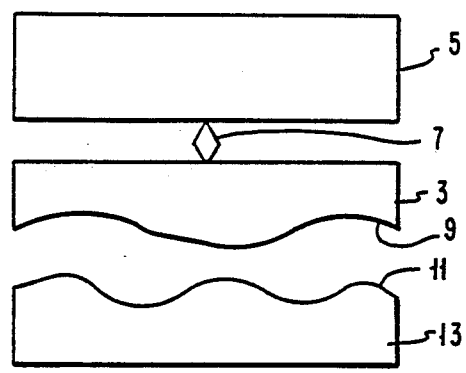
FIG. 1 diagrammatically shows the basic concept of the invention.

FIG. 1 diagrammatically shows the concept of the present invention. Body 3 is movably mounted to support 5. Diamond shaped structure 7 represents the connection between body 3 and support 5 permitting surface 9 of body 3 to rotate in space so that when surface 9 is pressed against surface 11 of body 13, surface 9 rotates in space and is flush or intimately pressed against surface 11. In the preferred embodiment surfaces 9 and 11 are substantially planar. However, as shown in FIG. 1, this is not necessary and the invention is not limited to substantially planar surfaces. If the means permitting the surface 9 to rotate, permits solid angular rotation of surface 9 with respect to surface 11, surface 9 will contact surface 11 in at least three points which define a plane of intersection of surface 9 and 11. If means 7 permits only a plane angular rotation of surface 9 with respect to surface 11, surface 9 will contact surface 11 in at least two points.

Figure 2:
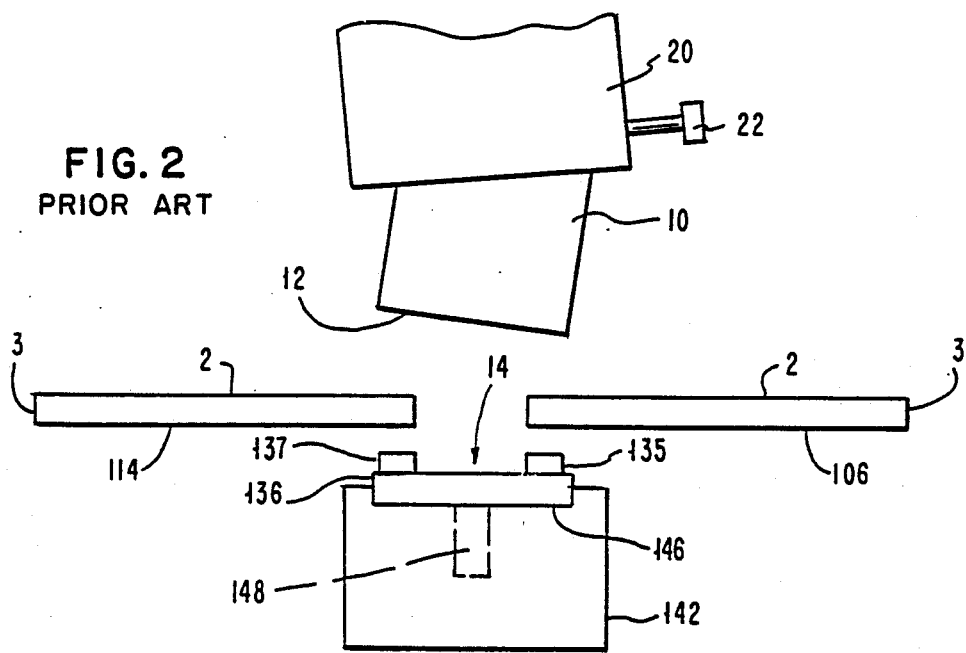
FIG. 2 shows beam leads aligned with contact locations on an electronic device with a bond head which is not parallel to the surface of the device.

FIG. 2 shows the inner ends of beam leads 2 aligned with contact locations 4 on electronic device 6 which is held by fixture 8. Bond head 10 is heated and aligned over the inner ends of the beam leads 2 for pressing the inner ends of the beam leads against the electronic device contact locations.

This type of bonding operation is commonly practiced in the art and referred to as thermocompression bonding. Bonding surface 12 of bond head 10 is shown in FIG. 2 not parallel to surface 14 of electronic device 6. Bonding surface 12 will contact beam lead inner end 16 prior to contacting beam lead inner end 18 when bond head holder 20 is moved towards electronic device 6.

Commonly available bonding tools have adjustment screws represented by 22 for manually adjusting bonding surface 12 to be parallel with respect to surface 14 of electronic device 6.

As noted above, to achieve parallel arrangement of bond surface 12 with surface 14 of electronic device 6 requires a trial and error adjustment of an adjustment screw represented by 22 in order to align bonding surface 12 in parallel arrangement with surface 14 of electronic device 6.

Figure 3:
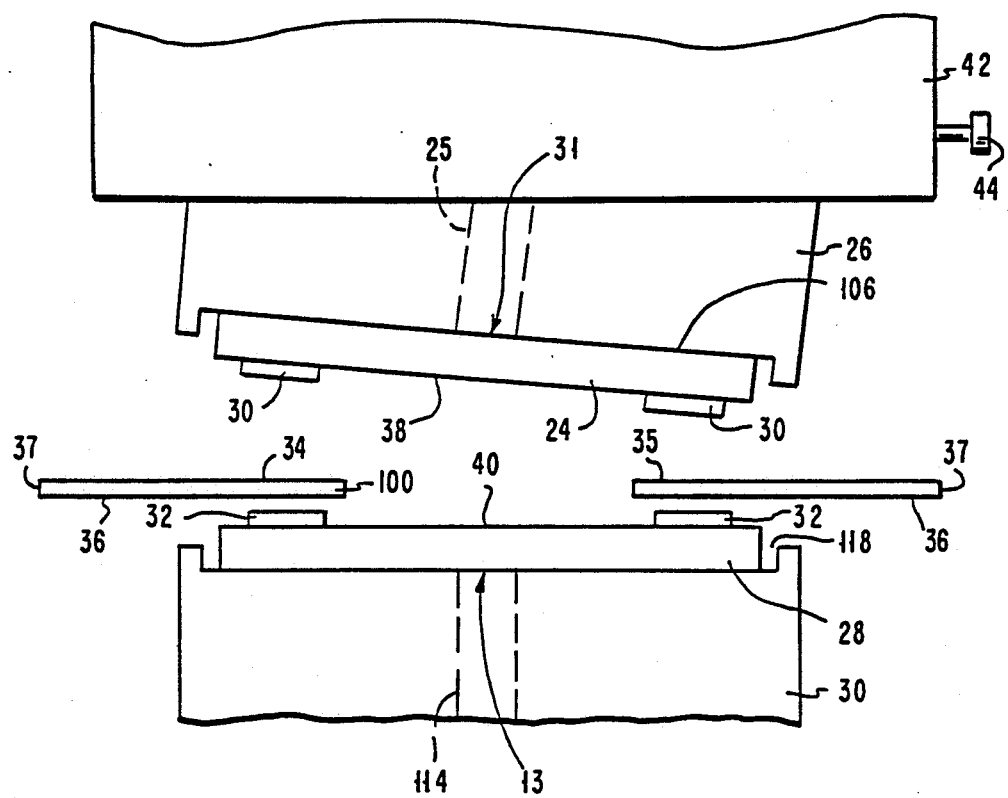
FIG. 3 shows a first and second electronic device with contact locations thereon aligned with leads which project outwardly from between the two devices wherein the first and second electronic device are not disposed in parallel relationship with respect to each other.

FIG. 3 shows an electronic device 24 held in fixture 26 and an electronic device 28 held in fixture 30, typically by vacuum pickup 31 and 33. Electronic device 24 has contact locations 30 thereon and electronic device 28 has contact locations 32 thereon. The inner ends 34 and 35 of beam leads 36 are aligned between contact pads 30 and contact pads 32. Fixture 26 is moved towards fixture 30 to press beam lead inner ends 34 and 35 between contact pad 30 on electronic device 24 and contact pad 32 on electronic device 28. One or both of fixtures 26 and 30 are heated. This forms a thermal compression bond between contact pads 30, 32 and the inner ends 34 and 35 of the beam leads.

As shown in FIG. 3, surface 38 of electronic device 24 is not parallel to surface 40 of electronic device 28. Therefore, beam lead inner ends 34 and 35 will not be pressed between contact locations 30 and 32 with equal force when fixture 26 is moved towards fixture 30 to press beam lead inner ends 34 and 35 between contact locations 30 and 32. Beam lead inner end 35 is pressed first between pads 30 and 32.

In commonly available tools, the orientation of fixture 26 with respect to holder 42 to which fixture 26 is attached, is adjusted by a screw means represented by 44. By trial and error surface 38 is adjusted to be parallel to surface 40 by means of screw adjustments 44.

The apparatus according to the present invention avoids the trial and error in manual adjustment methods as described above.

In tape automated bonding technology, a spaced series of beam lead sets are fabricated on an elongated flexible tape. The flexible tape can be wound onto reels and unwound from the reels for use in automated process to electrically connect electronic devices to the beam lead sets and to electrically connect the assembly of electronic device and beam lead sets onto a packaging substrate.

Figure 4:
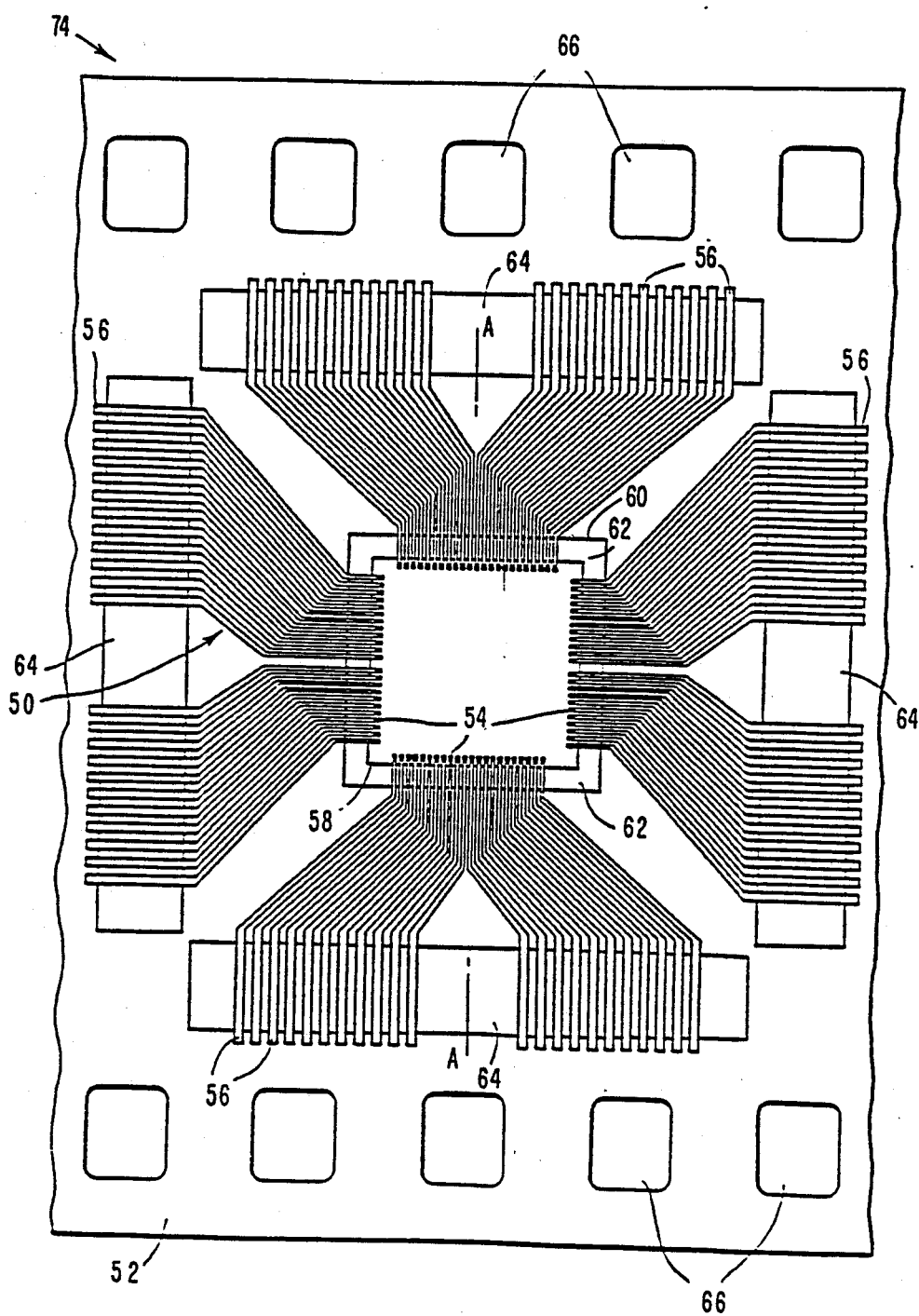
FIG. 4 diagrammatically shows a TAB type lead frame.

FIG. 4 shows one set of beam leads represented by 50 formed on a flexible film 52, each beam lead has an inner lead bond (ILB) end 54 and an outer lead bond (OLB) end 56. The ILB ends project inwardly towards a central location and are bonded to contact pads on an electronic device represented by 58. For the section 74 of tape, shown in FIG. 4, the ILB ends project inwardly in cantilevered fashion over the edge 60 of aperture 62 in film 52. At the OLB ends, the beam leads project over apertures 64. Apertures 64 provide an opening in the film 52 to form bonds at the OLB ends. Flexible film 52 has a series of sprocket holes 66 at the outer edges of the film. These sprocket holes permit alignment of the beam leads to contact pads to which both the ILB and the OLB will be electrically connected.

Generally, the sprocket holes permit only a coarse alignment of the ILB and OLB ends of the contact pads on a chip and a substrate, respectively. Commonly used optical systems are used to provide fine alignment of the ILB and OLB ends to contact pads on a chip and a substrate, respectively.

FIG. 4 is an example of only one type of metallized carrier for a spaced series of groups of beam leads. Another commonly used beam lead carrier has only one layer of metal in which a series of beam lead patterns are formed. The beam leads and the metal film are a unitary structure. The beam leads are formed by etching the beam lead patterns on the tape or alternatively, the leads may be patterned plated using photolithographic processes.

After a semiconductor chip is bonded to the ILB ends of the beam leads, the leads are severed, by methods commonly used in the art, from the metallized film in the region of the OLB ends in the region of aperture 64 in FIG. 4.

Figure 5:
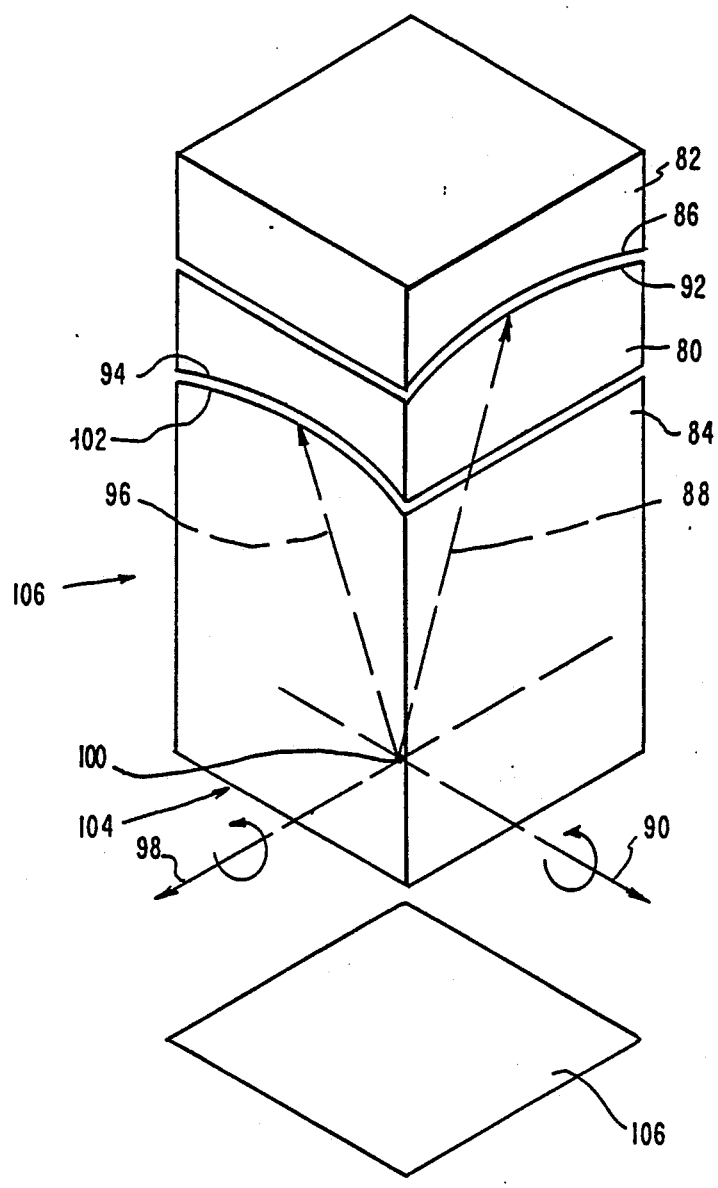
FIG. 5 diagrammatically shows the basic concept of the present invention wherein the apparatus has three major parts movably mounted with respect to each other about two axes of rotation.

FIG. 5 shows the basic concept of the preferred embodiment of the present invention. Y carriage 80 is movably mounted to base 82. X carriage 84 is movably mounted to Y carriage 80. Base 82 has a concave cylindrical surface 86 having radius of curvature 88 centered on axis 90. Y carriage 80 has a convex cylindrical surface 92 having radius of curvature 88 centered on axis 90. Cylindrical surface 92 is disposed in contact with cylindrical surface 86. Surface 92 slides along surface 86. Surface 94 of Y carriage 80 is opposite to surface 92 of Y carriage 80. Surface 94 is concave and cylindrical having radius of curvature 96 centered on axis 98. Preferably axis 98 intersects axis 90 at point 100. It is not necessary that axis 98 intersect axis 90. Preferably axes 98 and 90 are perpendicular. It is not necessary that axes 90 and 98 be perpendicular. Surface 102 of X carriage 84 has a convex cylindrical surface having radius of curvature 96 centered on axis 98. Cylindrical surface 102 is disposed against cylindrical surface 94. Cylindrical surface 102 is capable of sliding with respect to cylindrical surface 94. Substantially planar surface 104 of X carriage 84 is opposite to cylindrical surface 102 of X carriage 84. Surface 104 is not visible in the perspective of FIG. 5. If base 82 is moved in a direction so as to press surface 104 against a substantially planar surface 106 intersect and, surface 104 will change its orientation space so that surface 104 will be parallel to surface 106. If axis 98 and axis 90 are in the plane of surface 104, surface 104 will rotate about axis 98 and axis 90 and the point of intersection 100 will have no displacement perpendicular to the direction of motion of base 82. This occurs since X carriage 84 slides with respect to Y carriage 80 along the interface of surface 94 of Y carriage 80 and surface 102 of X carriage 84 to permit rotation about axis 98 and surface 92 of Y carriage 80 slides with respect to surface 86 of base 82 to permit rotation about axis 90.

Since the apparatus of FIG. 5 has two axes of rotation provided by the X carriage 84 and the Y carriage 80, there is no twist or rotation about an axis perpendicular to surface 104 when surface 104 is pushed against surface 106.

Therefore, the apparatus of FIG. 5 avoids the twisting described above with reference to the apparatus described in U.S. Pat. No. 3,574,923 to Cushman and the IBM TDB article to Jensen.

Variations on the concept of FIG. 5 will be apparent to those skilled in the art.

The invention will be further described in terms of a specific application of the concept of FIG. 5 to a bonding apparatus to bond lead frames of the type shown in FIG. 4 to electronic devices by the bonding operations shown in FIGS. 2 and 3. The concept shown in FIG. 5 is not limited to these applications.

Figure 6:
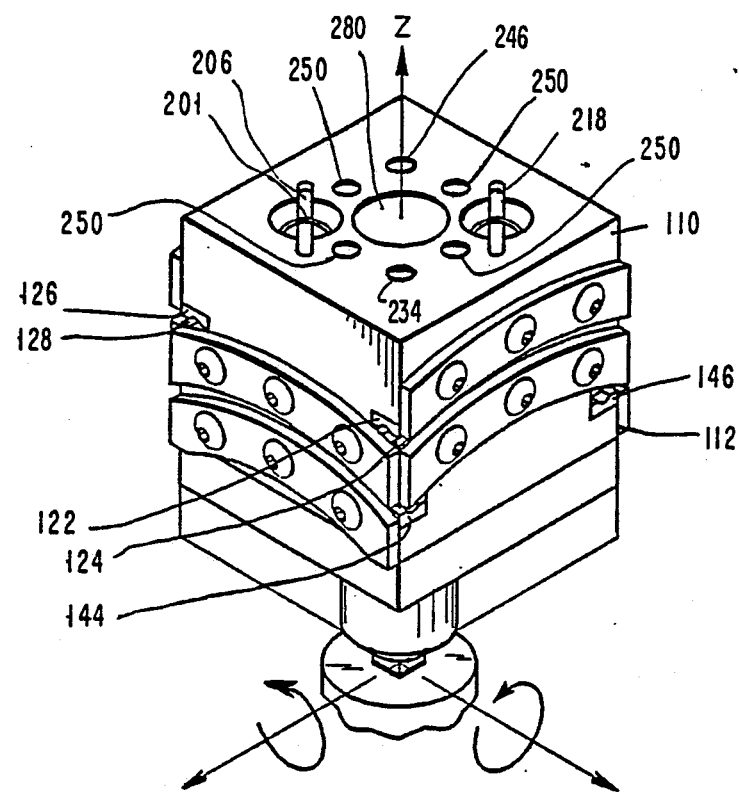
FIG. 6 is a perspective view of the preferred embodiment of the apparatus according to the present invention.

FIG. 6 shows a bonding tool in perspective view according to the present invention.

Figure 7:
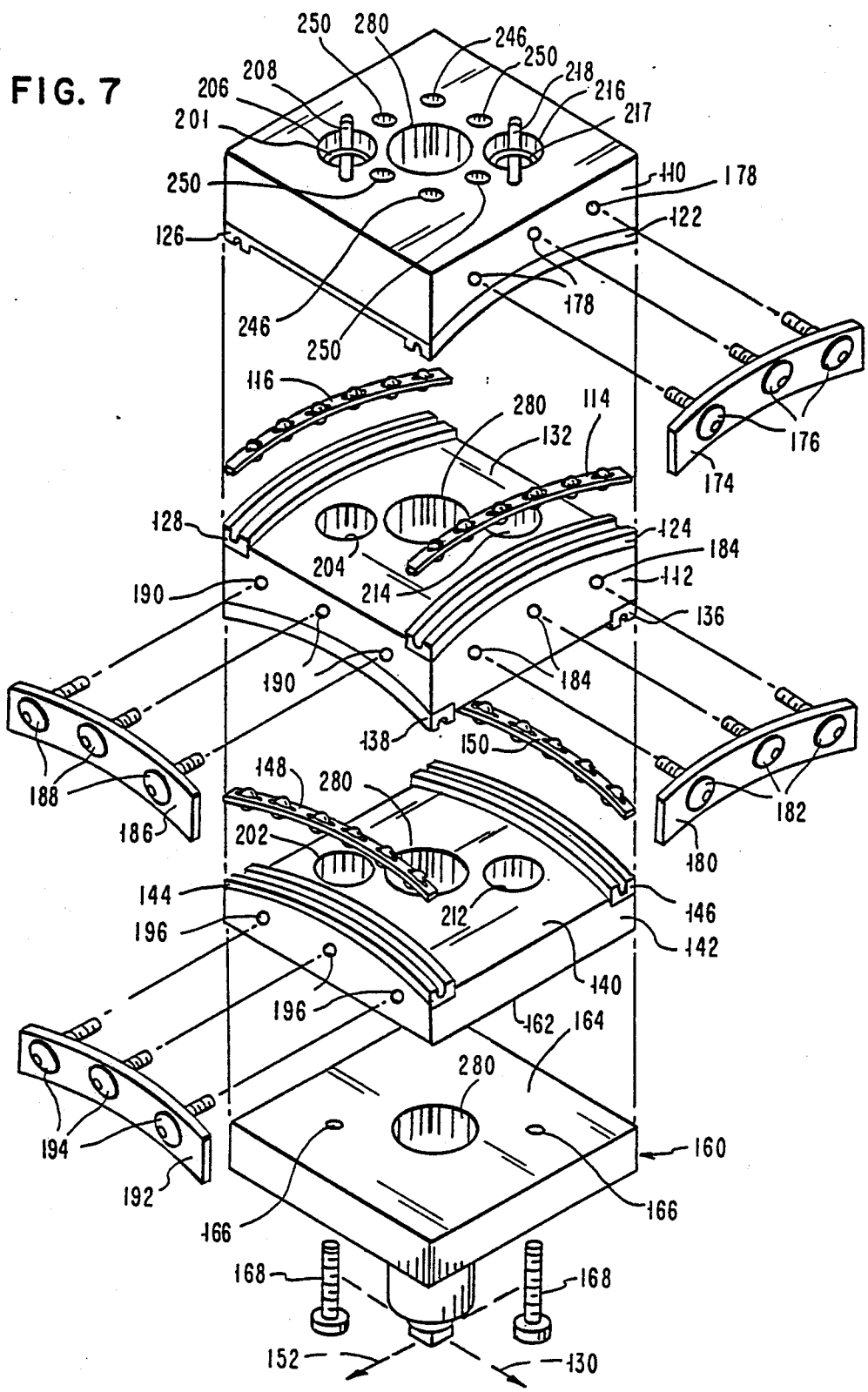
FIG. 7 shows the structure of FIG. 6 partially disassembled.

FIG. 7 shows the structure of FIG. 6 partially disassembled.

Figure 10:
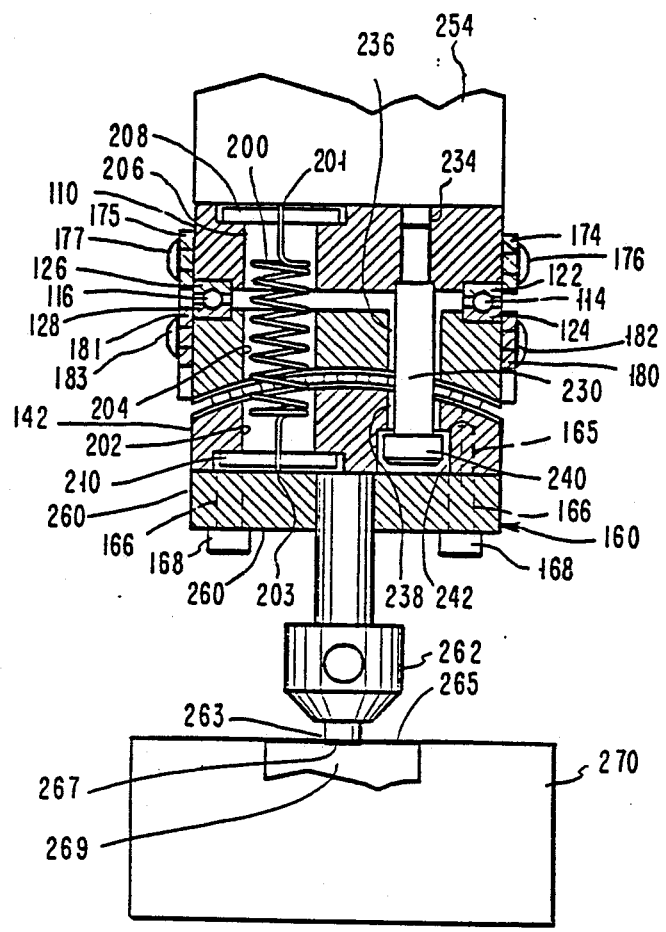
FIG. 10 is a cross sectional view of the structure of FIG. 6 along the line A in the direction indicated in the top view of FIG. 12.
Figure 12:
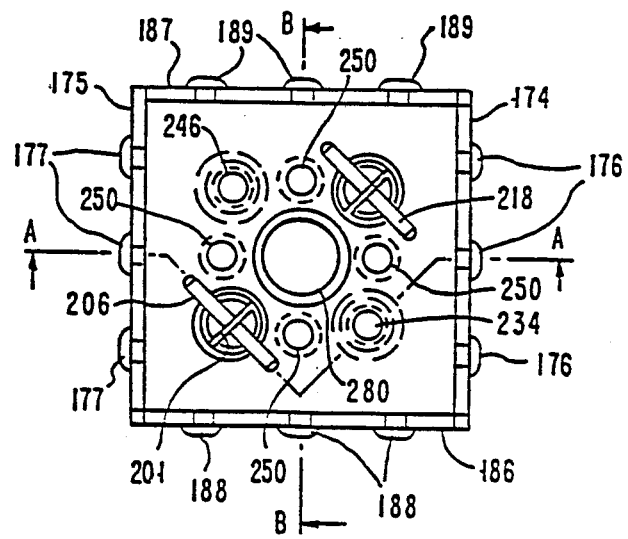
FIG. 12 is a top view of the structure shown in FIG. 6.

FIG. 10 shows the structure of FIG. 6 in cross section along line A in the direction indicated in FIG. 12.

Figure 11:
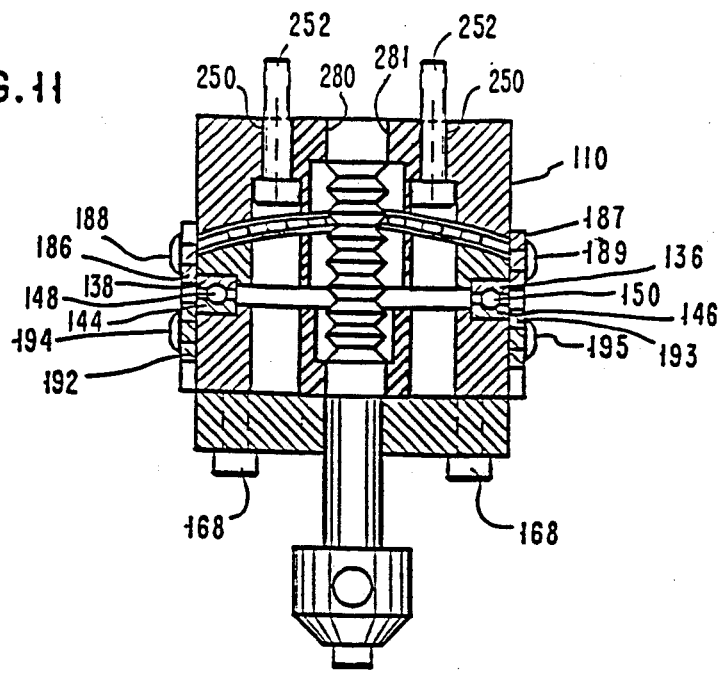
FIG. 11 is a cross sectional view of the structure shown in FIG. 6 along the line B in the direction indicated in the top view of FIG. 12.

FIG. 11 shows the structure of FIG. 10 in cross section along line B in the direction indicated in FIG. 12.

FIG. 12 is a top view of the structure of FIG. 6.

All numbers common between FIGS. 6, 7, 10, 11 and 12 represent the same thing.

Figure 8:
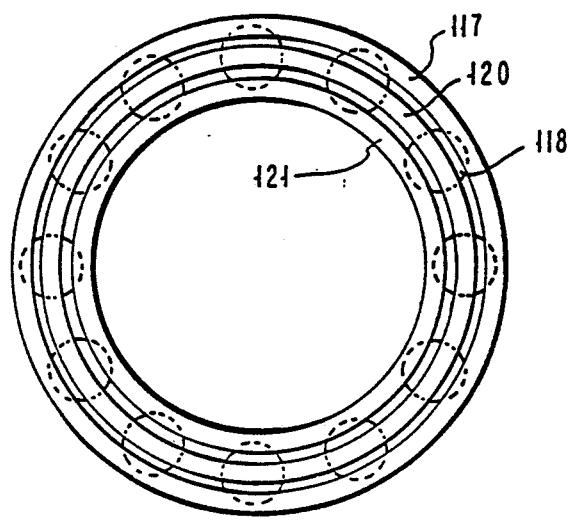
FIG. 8 is a side view of a typical bearing assembly.
Figure 9:
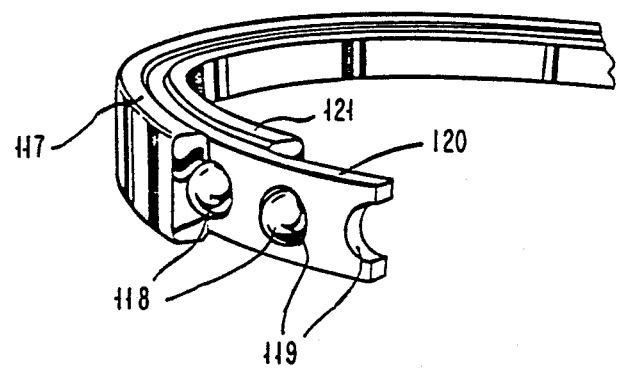
FIG. 9 is a perspective sectional view of the structure of FIG. 8.

Turning to FIG. 7, base 110 is movably mounted to Y carriage 112 by means of ball bearings held in ball bearing cages 114 and 116. FIG. 8 shows a side view of a commonly available ball bearing assembly. A plurality of balls 118 are maintained in a spaced apart relationship in apertures 119 in retainer or cage 120. The balls roll on grooves in an outer race 117 and an inner race 121. FIG. 9 is a perspective sectional view of the structure of FIG. 8. The bearing races and retainers used in the structure of FIG. 7 are cut out from an assembly as shown in FIG. 8. For the purpose of this application a bearing race and a bearing track mean the same thing. The balls of bearing assembly 114 roll in outer race 122 of base 110 and roll in inner race 124 of Y carriage 112. The balls of bearing assembly 116 roll in outer race 126 of base 110 and in inner race 128 of Y carriage 112. Bearing races 126 and 122 form a cylindrical surface as described with regard to FIG. 5. Bearing race 128 and 124 form a cylindrical surface on Y carriage 112 as described with reference to FIG. 5. The arrangement of bearing assemblies 116 and 114 and the bearing races on base 110 and 112 permit Y carriage 112 to slide with respect to base 110 along a circular arc having an axis of rotation 130. Cylindrical surface 132 of Y carriage 112 supports bearing races 128 and 124. Cylindrical surface 134 of Y carriage 112 carries bearing race 136 and 138. Cylindrical surface 140 of X carriage 142 supports bearing race 144 and 146. Bearing assembly 148 is disposed between bearing race 138 on Y carriage 112 and bearing race 144 on X carriage 142. Bearing assembly 150 is disposed between bearing race 136 on Y carriage 112 and bearing race 146 on X carriage 142. The arrangement of bearing assemblies 148, 150 and bearing races 138, 144, 136 and 146 permit the X carriage 142 to slide with respect to the Y carriage 112. Bearing races 138 and 136 form a cylindrical surface having axis 152. Bearing races 144 and 146 form a cylindrical surface having axis 152. Bond head assembly 160 is attached to surface 162 of X carriage 122. Surface 162 is opposite to surface 140 of X carriage 142. Surface 164 of bond assembly 160 has holes 166 through which screws 168 are inserted for attaching assembly 160 surface 162 of X carriage 142. Bearing race 122 is held in place by bearing retainer 174 which is held in place by a plurality of screws 176 which are screwed into tapped holes 178 of base 110. Bearing race 126 is held in place by bearing retainer 175 and screws 177. Bearing race 124 is held in place by bearing retainer 180 which is held in place by a plurality of screws 182 which are screwed into tapped hole 184 of Y carriage 112. Bearing race 128 is held in place by a bearing retainer plate 181 and screws 183. Bearing race 138 is held in place by bearing retainer plate 186 which is held in place by a plurality of screws 188 which are screwed into tapped holes 190 on Y carriage 112. Bearing race 136 is held in place by a bearing retaining plate 187 and screws 189. Bearing race 144 is held in place by retainer plate 192 which is held in place by screws 194 which are screwed into tapped holes 196 in X carriage 142. Bearing race 146 is held in place by bearing retainer plate 193 and screws 195. The use of retainer plates to hold the bearing tracks in place are commonly in use in the art. Base 110, the Y carriage and the X carriage are held together with the bearing assemblies between corresponding bearing races by two springs. One spring 200 is shown in FIG. 10. Spring 200 passes through aperture 202 in X carriage 142 and through aperture 204 in Y carriage 112 and through aperture 206 in base 110. One end 201 of spring 200 is fixed to pin 208 which spans across aperture 206 in base 110. The other end 203 of spring 200 is fixed to pin 210 which spans across aperture 202 in X carriage 142. The second spring passes through aperture 212 in X carriage 142, through aperture 214 in Y carriage 112 and through aperture 216 in base 110. The second spring is only partially shown in the figures. One end 217 of the second spring is fixed to pin 218 which spans across aperture 216. The other end of the second spring is fixed to a pin which spans across aperture 212.

The relative degree of movement between base 110, Y carriage 112 and X carriage 142 is constrained by two shoulder screws, one of which is shown in FIG. 10 as 230. One end 232 of shoulder screws 230 is screwed into tapped hole 234 in base 110. Pin 232 extends through an aperture 236 in Y carriage 112 and through an aperture 238 in X carriage 142. Apertures 236 and 238 have a larger cross sectional area than does shoulder screws 232 which is inserted through those apertures. Therefore, there is an empty space surrounding shoulder screw 232 in aperture 236 and surrounding shoulder screw 232 in aperture 238. This space permits both the X and Y carriage to move relative to base 110 only up until the edge of apertures 236 and 238, respectively, butt up against shoulder screw 232. The end of shoulder screw 232 opposite to end 230 has a head 240. Head 240 sits in an end 242 of aperture 238, which has a larger cross sectional area than head 240. Head 240 prevents pulling apart the assembly of base 110, Y carriage 112 and X carriage 142. The second constraining pin is screwed into tapped hole 246 which is shown in FIG. 12. The second constraining pin is not otherwise shown in the figures. Bolts 252 are inserted through apertures 250 in base 110 for attachment of the assembly shown in FIG. 6 to a bonding machine shown in FIG. 10 as 254.

Bond head 160 has two major parts: thermode bracket 260 and thermode 262. The thermode 260 is the same as a thermode commonly used in the electronic art for thermal compression bonding. At the end of thermode 262 is either a bond head knife as shown as 10 in FIG. 2 or a chip holding fixture such as shown in FIG. 3 as 26. A beam lead set on tape 265 is held between bond head tip end 263 and chip 267 is held in chip nest 269 of fixture 270. The surface 12 of the thermode knife of FIG. 2 is in the plane formed by the intersection of the rotation axes 130 and 152. When an electronic device is held at the thermode end, the contact locations 30 of the electronic device 24 as shown in FIG. 3 is in the plane formed by the intersection of the rotation axes 130 and 152. The apparatus of the present invention can also be used for solder bonding the lead ends to contact locations on a substrate. The apparatus of the present invention can be used to bond the outer lead ends 3 in FIG. 2 and 37 of FIG. 3 to contact locations on a substrate. When an electronic device is held in the thermode end 263, a vacuum pickup shown in FIG. 3 as 25 is used to hold the chip in place at thermode tip end 263. The apparatus of FIG. 6 has a central cavity 280 which extends through base 110, Y carriage 112 and X carriage 142 and through the bond head 160. In FIG. 11, there is shown in cavity 280 a bellows 281 which is preferably made from stainless steel which is sufficiently flexible to flex along with the relative movements of base 110, Y carriage 112 and X carriage 142. A tube adequate for this application is Servometer Corp. FCl.

Base 110, X carriage 142 and Y carriage 112 can be made of any rigid material such as for example brass, copper and aluminum, they are preferably made of stainless steel. Bearing races can be made from similar rigid materials, they are preferably made of hardened steel. The ball bearings can be made of similar rigid materials; they are preferably made of hardened steel. The bearing retainers can be made of similar rigid materials; they are preferably made of stainless steel. The springs can be made of carbon or stainless steel, they are preferably made of stainless steel. The bond head 160, can be made of similar rigid materials, it is preferably made of stainless steel. These materials are exemplary only and not limiting.

In the preferred embodiment, for a semiconductor chip of about 1cm², radius 88 is about 7 cm. and radius 96 is about 6 cm. The maximum rotation about axis 130 and 152 has been found to be about 0.5 degrees. In the FIGS. 6, 7, 10 and 12 bond head 160 is shown attached to x-carriage 142.

In summary, the invention is an apparatus for automatically adjusting the orientation of a first substantially planar surface of a first body to be substantially parallel to a second substantially planar surface of a second body when said first surface is pressed against said second surface.

Figure 13:
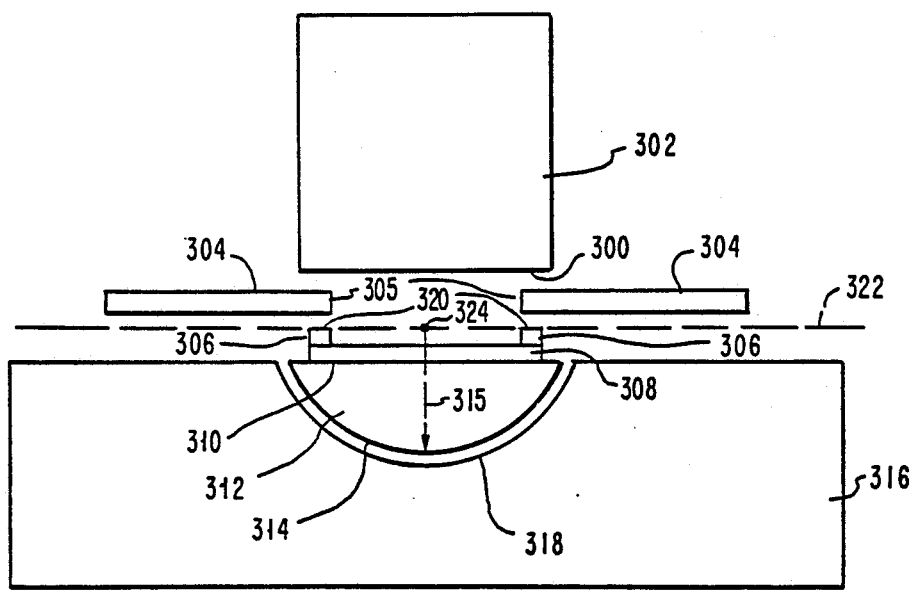
FIG. 13 diagrammatically shows another embodiment of the present invention.

FIG. 13 diagrammatically shows an embodiment of the invention wherein lateral displacement of the first surface, which rotates when pressed against the second surface is avoided. Bond head tip 300 of bond head 302 is aligned with beam leads 304 whose inner ends are aligned with pads 306 on electronic device 308. Electronic device rests on surface 310 of carriage 312. Carriage 312 can be made of a polyimide e.g., Vespel (manufactured by DuPont) which has low friction, a low heat transfer coefficient which is desirable for a bonding operation and can withstand bonding temperatures. Carriage 312 has a convex spherical surface 314 of radius 315. Convex surface 314 rests in a cavity in base 316. The cavity has a concave spherical surface 318 of substantially the same radius 315 as surface 314. Convex surface 314 of carriage 312 is movably mounted to concave surface 318. Both surfaces are polished smooth to reduce friction. A lubricant such as oil can be disposed between convex surface 314 and concave surface 318. Alternatively, either or both concave surface 314 and convex surfaces 318 can be coated with a low friction material such as polytetra fluoroethylene and the like. The top surface 320 of contact pads 306 are substantially in a plane 322 containing the center 324 of the spherical surface 314. Bond head tip 300 is moved towards device 306. The ends of leads 304 are pressed against the contact pads 320. The plane of the contact pads rotates about point 324 to be substantially parallel to the plane formed by the lead ends. Therefore, there is equal force between the lead ends 305 and the contact pads 320. Spherical surface center 324 has no lateral movement avoiding problems associated with the bond lead tip 300 laterally pushing on the leads as described above with regards to U.S. Pat. No. 3,574,925 to Chisham and the IBM TDB article to Jensen. Although the apparatus of FIG. 13 is shown as an electronic device bonding apparatus it is not limited to such applications. When used for bonding applications the bond head tip can be on the moving carriage 312, and an electronic device can be held in a fixture above it. Also double chip structures can be fabricated, by having one chip on the moving carriage and one chip held on a fixture above it with leads pressed therebetween. When the apparatus of FIG. 13 is used for bonding, the bond head 302 is generally heated.

While the invention has been particularly shown and described with reference to the preferred embodiments thereof, it will be understood by those of skill in the art that changes in form and detail may be made therein without departing from the spirit and scope of the invention.

What is claimed:

1. An apparatus for adjusting the orientation of a first surface of a first body to be substantially against a second surface of a second body when said first surface is pressed against said second surface, said apparatus comprising:
   a support for said first body;
   means for pressing said first surface against said second surface;
   means for movably mounting said first surface by curved surfaces to said support, permitting rotation of said first surface about a first axis and a second axis, so that when said support is moved to press said first surface against said second surface, said first surface rotates about said first and second axis, resulting in said first surface being substantially against said second surface; and
   said first axis and said second axis are substantially fixed in orientation and position with respect to said support as said first surface rotates.

2. The apparatus of claim 1, wherein said first axis and said second axis are perpendicular.

3. The apparatus of claim 1, wherein said first axis and said second axis intersect.

4. The apparatus of claim 1, wherein said means for movably mounting said first body to said support comprises:
   a base attached to said support, said base having a cylindrically concave surface having a first radius and a first axis;
   a first carriage, said first carriage having a cylindrically convex surface having a radius and axis substantially the same as said first radius and said first axis, said cylindrically concave surface of said base movably mounted to said cylindrically convex surface of said first carriage;
   said first carriage having a cylindrically concave surface having a second radius and a second axis;
   a second carriage, said second carriage having a cylindrically convex surface having a radius and axis substantially the same as said second radius and said second axis, said cylindrically concave surface of said first carriage movably mounted to said cylindrically convex surface of said second carriage; and
   said second carriage having said first surface.

5. The apparatus of claim 4, wherein said first axis and said second axis intersect and wherein said first surface is substantially planar and contains said first and said second axis.

6. The apparatus of claim 5, wherein said first axis and said second axis are perpendicular.

7. The apparatus of claim 4, wherein said concave surface of said base is movably mounted to said convex surface of said first carriage by a bearing means and said concave surface of said first carriage is movably mounted to said convex surface of said second carriage by a bearing means.

8. The apparatus of claim 7, wherein said bearing means comprises at least two bearing assemblies containing a plurality of bearing balls sandwiched between bearing tracks.

9. The apparatus of claim 1, wherein said first and said second surface are substantially planar.

10. The apparatus of claim 1, wherein said apparatus is a bonding tool for bonding the ends of a plurality of beam leads to a plurality of contact locations on a substrate, said first surface being a bondhead for pressing said ends against said contact locations and said second surface being said plurality of said contact locations.

11. The apparatus of claim 1, wherein said apparatus is a bonding tool for bonding a plurality of contact locations on a first substrate to a plurality of contact locations on a second substrate, said first surface being said plurality of contact locations on said first substrate and said second surface being said plurality of contact locations on said second substrate.

12. The apparatus of claim 1, wherein said first surface rotates about a substantially fixed point substantially in said first surface, said first and said second axis substantially intersecting at said point.

13. An apparatus for adjusting the orientation of a first surface of a first body to be substantially against a second surface of a second body when said first surface is pressed against said second surface, said apparatus comprising:
- a support for said first body;
- means for pressing said first surface against said second surface;
- means for movably mounting said first body to said support, permitting rotation of said first surface about a first axis and a second axis, so that when said support is moved to press said first surface against said second surface, said first surface rotates about said first and second axis, resulting in said first surface being substantially against said second surface;
- said means for movably mounting said first body to said support comprises:
- a base attached to said support, said base having a cylindrically concave surface having a first radius and a first axis;
- a first carriage, said first carriage having a cylindrically convex surface having a radius and axis substantially the same as said first radius and said first axis, said cylindrically concave surface of said base movably mounted to said cylindrically convex surface of said first carriage;
- said first carriage having a cylindrically concave surface having a second radius and a second axis;
- a second carriage, said second carriage having a cylindrically convex surface having a radius and axis substantially the same as said second radius and said second axis, said cylindrically concave surface of said first carriage movably mounted to said cylindrically convex surface of said second carriage;
- said second carriage having said first surface; and
- means for holding said base, said first carriage and said second carriage together.

14. An apparatus for adjusting the orientation of a first surface of a first body to be substantially against a second surface of a second body when said first surface is pressed against said second surface, said apparatus comprising:
- a support for said first body;
- means for pressing said first surface against said second surface; and
- means for movably mounting said first body to said support, permitting rotation of said first surface about a first axis and a second axis, so that when said support is moved to press said first surface against said second surface, said first surface rotates about said first and second axis, resulting in said first surface being substantially against said second surface.
- said means for movably mounting said first body to said support comprises:
- a base attached to said support, said base having a cylindrically concave surface having a first radius and a first axis;
- a first carriage, said first carriage having a cylindrically convex surface having a radius and axis substantially the same as said first radius and said first axis, said cylindrically concave surface of said base movably mounted to said cylindrically convex surface of said first carriage;
- said first carriage having a cylindrically concave surface having a second radius and a second axis;
- a second carriage, said second carriage having a cylindrically convex surface having a radius and axis substantially the same as said second radius and said second axis, said cylindrically concave surface of said first carriage movably mounted to said cylindrically convex surface of said second carriage;
- said second carriage having said first surface; and
- said first surface is held to said first body by a vacuum applied through a flexible member extending through an aperture in said means for movably mounting said first body to said support.

15. The apparatus of claim 10, wherein said flexible member is a bellows.

16. An apparatus for automatically adjusting the orientation of a first substantially planar surface of a first body to be substantially parallel to a second substantially planar surface of a second body when said first surface is pressed against said second surface, said apparatus comprising:
- a base having a cylindrically concave surface having a first radius and a first axis;
- a first carriage, said first carriage having a cylindrically convex surface having a radius and axis substantially the same as said first radius and said first axis, said cylindrically concave surface of said base movably mounted to said cylindrically convex surface of said first carriage;
- said first carriage having a cylindrically concave surface having a second radius and a second axis, said second axis being substantially perpendicular to and intersecting said first axis;
- a second carriage, said second carriage having a cylindrically convex surface having a radius and axis substantially the same as said second radius and said second axis, said cylindrically concave surface of said first carriage movably mounted to said cylindrically convex surface of said second carriage;
- said second carriage having a substantially planar surface defined by the intersection of said first axis and said second axis and
- said first axis and said second axis are substantially fixed in orientation and position with respect to said base as said first surface rotates when pressed against said second surface.

17. The apparatus of claim 16, wherein said concave surface of said base is movably mounted to said convex surface of said first carriage by a bearing means and said concave surface of said first carriage is movably mounted to said convex surface of said second carriage by a bearing means.

18. The apparatus of claim 16, wherein said apparatus is a bonding tool for bonding the inner ends of a plurality of beam leads to a plurality of contact locations on a substrate, said first substantially planar surface being a bondhead for pressing said inner ends against said contact locations and said second substantially planar surface being said plurality of said contact locations.

19. The apparatus of claim 16, wherein said apparatus is a bonding tool for bonding a plurality of contact locations on a first substrate to a plurality of contact locations on a second substrate, said first substantially planar surface being said plurality of contact locations on said first substrate and said second substantially planar surface being said plurality of contact locations on said second substrate.

20. An apparatus for automatically adjusting the orientation of a first substantially planar surface of a first body to be substantially parallel to a second substantially planar surface of a second body when said first surface is pressed against said second surface, said apparatus comprising:
- a base having a cylindrically concave surface having a first radius and a first axis;
- a first carriage, said first carriage having a cylindrically convex surface having a radius and axis substantially the same as said first radius and said first axis, said cylindrically concave surface of said base movably mounted to said cylindrically convex surface of said first carriage;
- said first carriage having a cylindrically concave surface having a second radius and a second axis, said second axis being substantially perpendicular to and intersecting said first axis;
- a second carriage, said second carriage having a cylindrically convex surface having a radius and axis substantially the same as said second radius and said second axis, said cylindrically concave surface of said first carriage movably mounted to said cylindrically convex surface of said second carriage;
- said second carriage having a substantially planar surface defined by the intersection of said first axis and said second axis; and
- said concave surface of said base is movably mounted to said convex surface of said first carriage by a bearing means and said concave surface of said first carriage is movably mounted to said convex surface of said second carriage by a bearing means.

21. An apparatus for automatically adjusting the orientation of a first surface to be in contact with a second surface at more than one location when said first surface is pressed against said second surface, said apparatus comprising:
- a support for said first surface;
- means for pressing said first surface against said second surface; and
- means for movably mounting said first surface to said support, permitting rotation of said first surface with respect to said support, so that when said first surface is pressed against said second surface, said first surface rotates about a substantially fixed point substantially on said first surface, resulting in said first surface contacting said second surface at more than one location.

22. The apparatus of claim 21, wherein said first and said second surface are substantially planar and when pressed together are substantially flush and parallel.

23. The apparatus of claim 21, wherein said apparatus is an electronic device bonding apparatus.

24. The apparatus of claim 21, wherein said means for movably mounting said first body to said support comprises:
- a base attached to said support;
- said base having a substantially spherically concave surface of a predetermined radius;
- a carriage having a substantially spherically convex surface having substantially the same radius as said concave surface of said base;
- said carriage has a substantially planar surface containing the center of said substantially spherical convex surface of said carriage; and
- said concave surface of said base is movably mounted to said convex surface of said carriage.

25. The apparatus of claim 24, wherein said concave surface of said base is movably mounted to said convex surface of said carriage by disposing said convex surface against said concave surface with a lubricant therebetween.

26. The apparatus of claim 21, wherein said means for movably mounting said first body to said support comprises:
- a base attached to said support, said base having a cylindrically concave surface having a first radius and a first axis;
- a first carriage, said first carriage having a cylindrically convex surface having a radius and axis substantially the same as said first radius and said first axis, said cylindrically concave surface of said base movably mounted to said cylindrically convex surface of said first carriage;
- said first carriage having a cylindrically concave surface having a second radius and a second axis;
- a second carriage, said second carriage having a cylindrically convex surface having a radius and axis substantially the same as said second radius and said second axis, said cylindrically concave surface of said first carriage movably mounted to said cylindrically convex surface of said second carriage; and
- said second carriage having said first surface.

27. The apparatus of claim 21, wherein there is a first and a second axis of rotation substantially intersecting at said point, said first surface rotates about said first and said second axis when rotating about said points.

28. The apparatus of claim 21, wherein said means for movably mounting said first surface to said support comprises curved surfaces.

* * * * *